(12) United States Patent
Bang et al.

(10) Patent No.: US 11,107,865 B2
(45) Date of Patent: Aug. 31, 2021

(54) ORGANIC LIGHT EMITTING DISPLAY DEVICE

(71) Applicant: Samsung Display Co., Ltd., Yongin-si (KR)

(72) Inventors: Jinsook Bang, Hwaseong-si (KR); Sanghoon Yim, Suwon-si (KR); Donghoon Kim, Suwon-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 16/662,630

(22) Filed: Oct. 24, 2019

(65) Prior Publication Data
US 2020/0273918 A1  Aug. 27, 2020

(30) Foreign Application Priority Data
Feb. 25, 2019 (KR) .................. 10-2019-0021755

(51) Int. Cl.
*H01L 27/32* (2006.01)

(52) U.S. Cl.
CPC ........ *H01L 27/322* (2013.01); *H01L 27/3211* (2013.01)

(58) Field of Classification Search
CPC ............................ H01L 27/3211; H01L 27/322
See application file for complete search history.

(56) References Cited

U.S. PATENT DOCUMENTS

| 7,808,585 | B2* | 10/2010 | Haga | G02F 1/133514 |
| | | | | 349/106 |
| 8,205,999 | B2* | 6/2012 | Karman | H01L 51/5265 |
| | | | | 362/97.1 |
| 8,330,356 | B2* | 12/2012 | Jeong | H01L 51/5036 |
| | | | | 313/504 |
| 8,963,138 | B2 | 2/2015 | Lim et al. | |
| 9,343,691 | B2* | 5/2016 | Seo | H01L 51/5237 |
| 9,563,000 | B2 | 2/2017 | Ko et al. | |
| 2005/0007322 | A1* | 1/2005 | Adachi | H01L 27/3248 |
| | | | | 345/82 |
| 2005/0035353 | A1* | 2/2005 | Adachi | H01L 51/5281 |
| | | | | 257/72 |
| 2005/0147844 | A1* | 7/2005 | Hatwar | H01L 27/322 |
| | | | | 428/690 |

(Continued)

FOREIGN PATENT DOCUMENTS

| KR | 10-2007-0039539 A | 4/2007 |
| KR | 10-2014-0014685 A | 2/2014 |

(Continued)

*Primary Examiner* — Mohammed Shamsuzzaman
(74) *Attorney, Agent, or Firm* — Lewis Roca Rothgerber Christie LLP

(57) ABSTRACT

An organic light emitting display device includes a first substrate, a second substrate opposite from the first substrate, a plurality of organic light emitting elements on the first substrate, and a color filter on the organic light emitting elements, wherein a transmission wavelength band of the color filter has an upper limit value for transmitting a light wavelength corresponding to a first intensity of a light emitted from the organic light emitting elements at a viewing angle of about 0°, and has a lower limit value for transmitting a light wavelength corresponding to a second intensity that is less than the first intensity.

13 Claims, 11 Drawing Sheets

(56) References Cited

U.S. PATENT DOCUMENTS

| | | | | |
|---|---|---|---|---|
| 2013/0175512 | A1* | 7/2013 | Kim | H01L 51/5004 |
| | | | | 257/40 |
| 2015/0123885 | A1* | 5/2015 | Adachi | G09G 3/3233 |
| | | | | 345/77 |
| 2016/0035795 | A1* | 2/2016 | Lim | H01L 27/322 |
| | | | | 257/40 |
| 2017/0261793 | A1* | 9/2017 | Son | G02F 1/133553 |
| 2019/0386077 | A1* | 12/2019 | He | H01L 51/5275 |
| 2020/0176516 | A1* | 6/2020 | Yan | H01L 27/322 |
| 2020/0243622 | A1* | 7/2020 | Chung | H01L 51/5012 |

FOREIGN PATENT DOCUMENTS

| | | |
|---|---|---|
| KR | 10-1361721 B1 | 2/2014 |
| KR | 10-1687876 B1 | 12/2016 |
| KR | 10-2017-0117961 A | 10/2017 |

\* cited by examiner

ORGANIC LIGHT EMITTING DISPLAY DEVICE

CROSS-REFERENCE TO RELATED APPLICATION

This application claims priority to and the benefit of Korean Patent Application No. 10-2019-0021755, filed on Feb. 25, 2019, in the Korean Intellectual Property Office (KIPO), the disclosure of which is incorporated by reference herein in its entirety.

BACKGROUND

1. Field

Aspects of the present invention relate to an organic light emitting display device.

2. Description of Related Art

In general, an organic light emitting display device (e.g., organic light emitting diode (OLED) display device) is a self-luminous display in which an organic compound is electrically excited to emit light. Such an organic light emitting display device may be driven at a low voltage, be easily slimmed down, and have a wide viewing angle and quick response speed. Accordingly, OLED display devices are attracting attention as next generation display devices that may solve the problems of the liquid crystal display (LCD) devices.

In such an organic light emitting display device, a light emitted from a self-luminous body and a reflected light, which is produced when an external incident light (natural light) enters from the outside and is reflected by an internal reflection plate, are mixed together. Accordingly, a black luminance is increased by the external light, and thus a contrast (CR) may be lowered, such that the display quality may be degraded. This is because when an amount of the reflected light becomes more than a certain level, as compared to an amount of light generated by the organic light emitting display device, the observer may also observe light of a wavelength other than a wavelength band realized by the organic light emitting display device.

A general organic light emitting display device includes a polarizing layer, which includes a linear polarizing plate and a quarter wave plate so as to suppress reflection of external light. A component oscillating in a direction parallel to a transmission axis of the linear polarizing plate among the external light incident to the organic light emitting display device is transmitted through the linear polarizing plate, and the transmitted component is converted into circularly polarized light that rotates in one direction as it passes through the quarter wave plate.

The circularly polarized light is converted into a circularly polarized light that rotates in the opposite direction, as it is reflected by a metal layer of the organic light emitting display device, and the circularly polarized light is converted into a linearly polarized light, as it passes through the quarter wave plate. In such a case, an oscillating direction of the linearly polarized light is orthogonal to the transmission axis of the linear polarizing plate, and thus it cannot pass through the linear polarizing plate. The polarizing layer significantly reduces reflection of external light, and improves outdoor visibility, by this principle.

However, not only the external light but also about half of the light emitted from the organic light emitting display device is absorbed by the linear polarizing plate, thereby lowering the luminous efficiency. Accordingly, a technique of forming a color filter has been proposed to replace such a polarizing layer.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention are directed to an organic light emitting display device including a color filter, in place of a conventional polarizing plate, in which a transmission wavelength band of the color filter is expanded toward shorter wavelengths so as to compensate for optical losses due to blue shift.

According to some embodiments of the present invention, there is provided an organic light emitting display device including: a first substrate; a second substrate opposite from the first substrate; a plurality of organic light emitting elements on the first substrate; and a color filter on the organic light emitting elements, wherein a transmission wavelength band of the color filter has an upper limit value for transmitting a light wavelength corresponding to a first intensity of a light emitted from the organic light emitting elements at a viewing angle of about 0°, and has a lower limit value for transmitting a light wavelength corresponding to a second intensity that is less than the first intensity.

In some embodiments, the lower limit value of the transmission wavelength band of the color filter is less than a lower limit value of a light wavelength of the organic light emitting elements corresponding to the first intensity.

In some embodiments, the organic light emitting element includes a red organic light emitting element, a green organic light emitting element, and a blue organic light emitting element, wherein the color filter includes a first color filter on the red organic light emitting element, a second color filter on the green organic light emitting element, and a third color filter on the blue organic light emitting element, and wherein lower limit values of transmission wavelength bands of the first color filter, the second color filter, and the third color filter are sequentially further apart from a lower limit value of a wavelength of each corresponding one of the organic light emitting elements corresponding to the first intensity.

In some embodiments, the organic light emitting element includes a red organic light emitting element, a green organic light emitting element, and a blue organic light emitting element, and the second intensity decreases in an order of the red organic light emitting element, the green organic light emitting element, and the blue organic light emitting element.

In some embodiments, the first color filter has a transmission wavelength band for transmitting a wavelength at which an intensity of a light emitted from the green organic light emitting element is substantially a same as an intensity of a light emitted from the red organic light emitting element at an arbitrary viewing angle of about 60° or less.

In some embodiments, the first color filter has a transmission wavelength band that does not transmit a wavelength corresponding to a peak point of the intensity of the light emitted from the green organic light emitting element at a viewing angle of about 60°.

In some embodiments, the second color filter has a transmission wavelength band for transmitting a wavelength at which an intensity of a light emitted from the blue organic light emitting element is substantially a same as an intensity of a light emitted from the green organic light emitting element at an arbitrary viewing angle of about 60° or less.

In some embodiments, the second color filter has a transmission wavelength band that does not transmit a wavelength corresponding to a peak point of the intensity of the light emitted from the blue organic light emitting element at a viewing angle of about 60°.

In some embodiments, the third color filter has a transmission wavelength band that transmits all wavelengths corresponding to a peak point of an intensity of a light emitted from the blue organic light emitting element at a viewing angle of about 0° to about 60°.

In some embodiments, an upper limit value of the transmission wavelength band of the third color filter is greater than a wavelength at a cross point at which an intensity of a light emitted from the blue organic light emitting element is substantially a same as an intensity of a light emitted from the green organic light emitting element, at a viewing angle of about 0°.

In some embodiments, a lower limit value of the transmission wavelength band of the first color filter about 515 nm to about 545 nm.

In some embodiments, the first color filter has a transmission wavelength band of about 515 nm to about 690 nm, the second color filter has a transmission wavelength band of about 460 nm to about 600 nm, and the third color filter has a transmission wavelength band of about 430 nm to about 510 nm.

In some embodiments, a lower limit value of the transmission wavelength band of the second color filter is about 460 nm to about 480 nm.

In some embodiments, an upper limit value of the transmission wavelength band of the third color filter about 515 nm to about 530 nm.

According to some embodiments of the present invention, there is provided an organic light emitting display device including: a first substrate; a second substrate opposite from the first substrate; a plurality of organic light emitting elements on the first substrate; a color filter on the organic light emitting elements; and a black matrix adjacent to the color filter, wherein the color filter includes a first color filter, a second color filter, and a third color filter, and wherein end portions of the black matrix adjacent to the first color filter, the second color filter, and the third color filter have taper angles different from each other.

In some embodiments, an end portion of the black matrix adjacent to the first color filter has a first inclination angle, and an end portion of the black matrix adjacent to the second color filter has a second inclination angle greater than the first inclination angle.

In some embodiments, an end portion of the black matrix adjacent to the third color filter has a third inclination angle greater than the second inclination angle.

In some embodiments, a separation distance between the first color filter and an end portion of the black matrix is greater than a separation distance between any one of the second color filter and the third color filter and the end portion of the black matrix.

In some embodiments, the organic light emitting element includes a red organic light emitting element, a green organic light emitting element, and a blue organic light emitting element, and the first color filter has a transmission wavelength band for transmitting a wavelength at which an intensity of a light emitted from the green organic light emitting element is substantially a same as an intensity of a light emitted from the red organic light emitting element at an arbitrary viewing angle of about 60° or less.

In some embodiments, the first color filter has a transmission wavelength band that does not transmit a wavelength corresponding to a peak point of the intensity of the light emitted from the green organic light emitting element at an arbitrary viewing angle of about 60° or less.

In some embodiments, the first color filter has a transmission wavelength band of about 515 nm to about 690 nm.

In some embodiments, the second color filter has a transmission wavelength band for transmitting a wavelength at which an intensity of a light emitted from a blue organic light emitting element is substantially a same as an intensity of a light emitted from a green organic light emitting element at an arbitrary viewing angle of about 60° or less.

In some embodiments, the second color filter has a transmission wavelength band that does not transmit a wavelength corresponding to a peak point of the intensity of the light emitted from the blue organic light emitting element at an arbitrary viewing angle of about 60° or less.

In some embodiments, a lower limit value of the transmission wavelength band of the second color filter about 460 nm to about 480 nm.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the present invention will become more apparent by describing in detail embodiments thereof with reference to the accompanying drawings, wherein.

DETAILED DESCRIPTION

Figure 1:
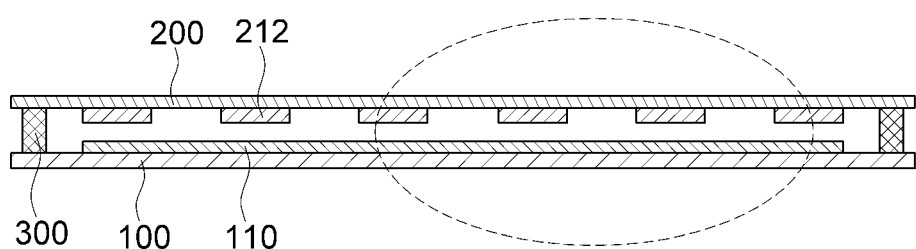
FIG. 1 is a schematic cross-sectional view illustrating an organic light emitting display device according to an example embodiment.

Embodiments will now be described more fully hereinafter with reference to the accompanying drawings. Although the invention may be modified in various manners and have several embodiments, embodiments are illustrated in the accompanying drawings and will be mainly described in the specification. However, the scope of the present invention is not limited to the embodiments and should be construed as including all the changes, equivalents and substitutions included in the spirit and scope of the present invention.

In the drawings, thicknesses of a plurality of layers and areas are illustrated in an enlarged manner for clarity and ease of description thereof.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts that are not associated with the description may not be provided in order to specifically describe embodiments of the present invention and like reference numerals refer to like elements throughout the specification.

Figure 2:
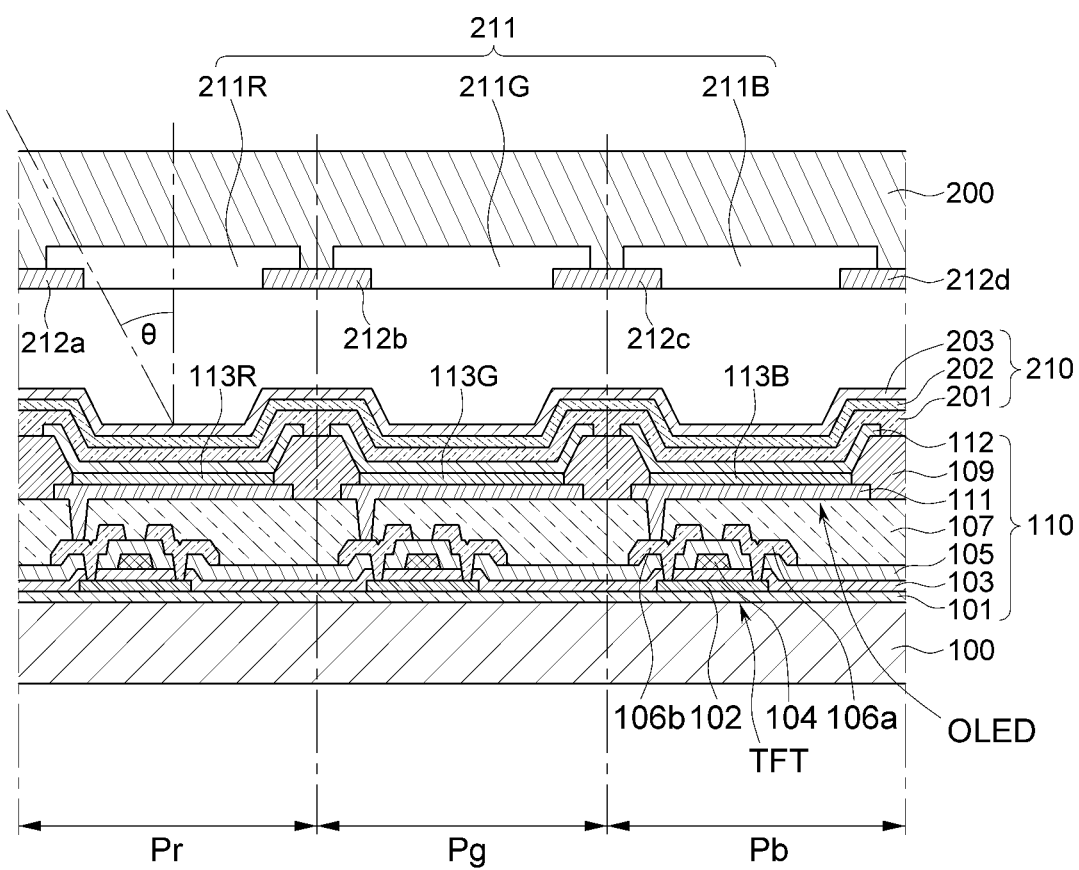
FIG. 2 is an enlarged cross-sectional view illustrating a display unit of the organic light emitting display device of FIG. 1.
Figure 3A:
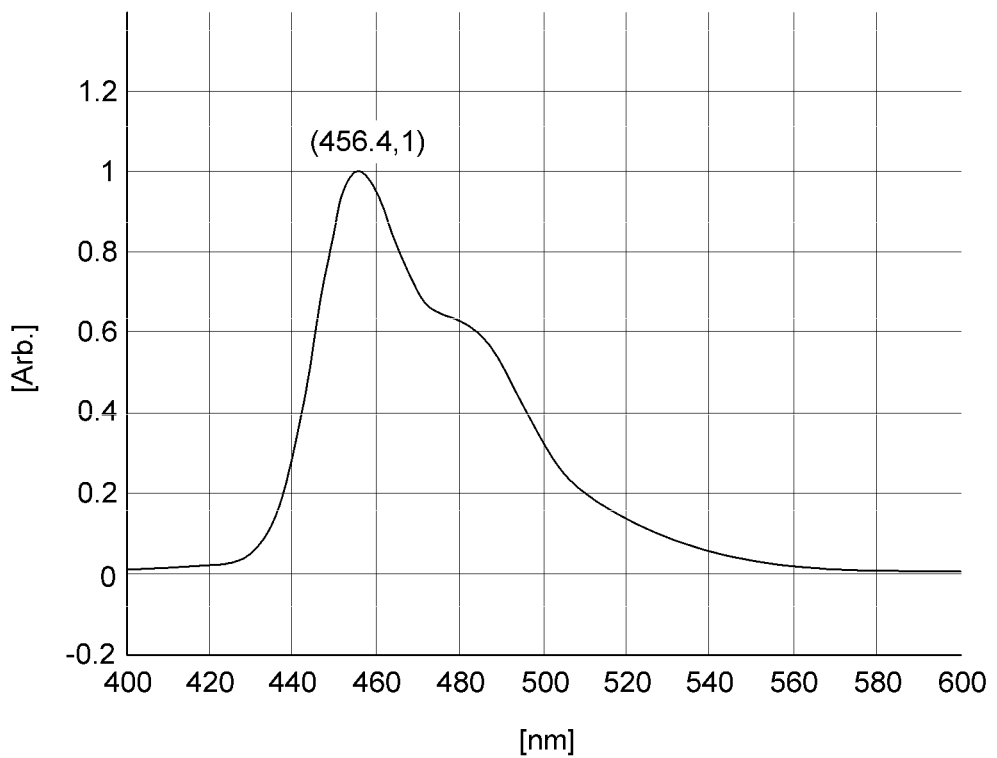
FIGS. 3A-3B are graphs illustrating an emission spectrum before resonance and an emission spectrum after resonance in an organic light emitting element having a resonance structure.
Figure 3B:
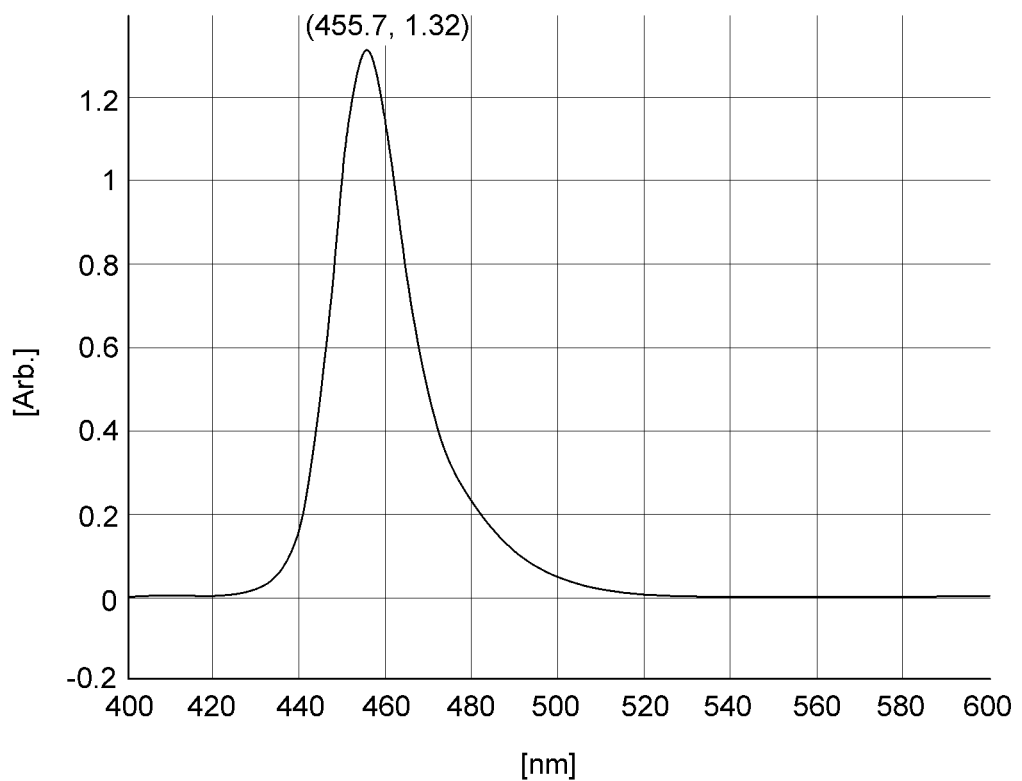
Figure 4:
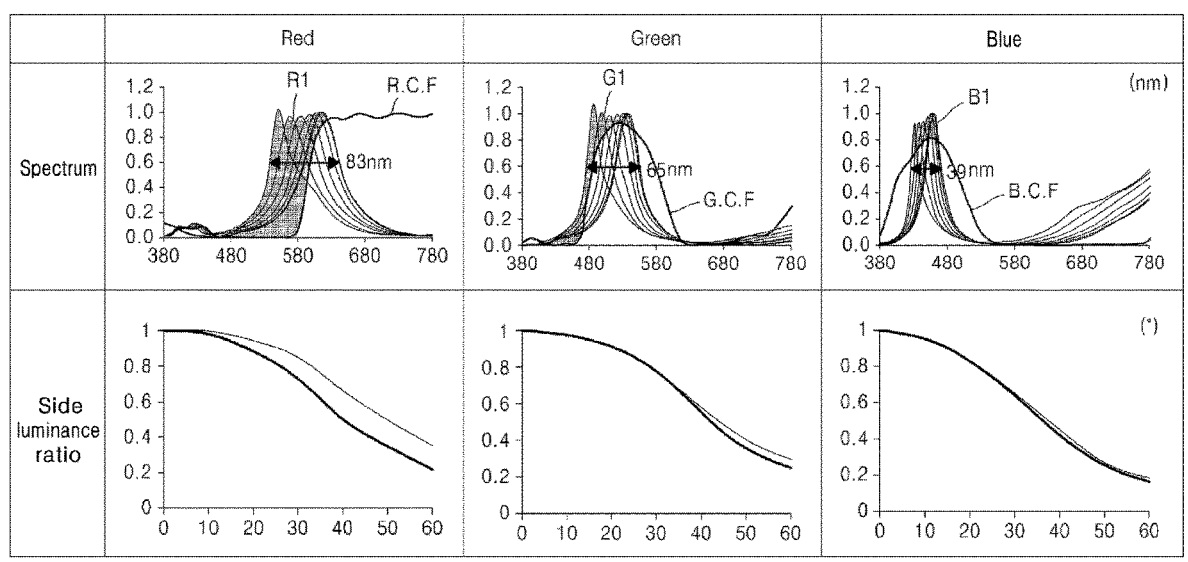
FIG. 4 is a graph illustrating emission spectra of an organic light emitting element having a resonance structure and relevant changes in side luminance ratios.

FIG. 1 is a schematic cross-sectional view illustrating an organic light emitting display device according to an embodiment; FIG. 2 is an enlarged cross-sectional view illustrating a display unit of the organic light emitting display device of FIG. 1; FIGS. 3A and 3B are graphs illustrating an emission spectrum before resonance and an emission spectrum after resonance in an organic light emitting element having a resonance structure; and FIG. 4 is a graph illustrating emission spectra of an organic light emitting element having a resonance structure and relevant changes in side luminance ratios.

Hereinafter, an organic light emitting display device according to an embodiment will be described with reference to FIGS. 1 and 2.

An organic light emitting display device according to an embodiment includes a first substrate 100, a display unit 110 formed on the first substrate 100, a second substrate 200, a black matrix 212 formed on the second substrate 200, and a support portion 300 for supporting the first substrate 100 and the second substrate 200.

The first substrate 100 may include various flexible materials. For example, the first substrate 100 may include plastic with excellent heat resistance and durability, such as polyethylene ether phthalate (PET), polyethylene naphthalate (PEN), polycarbonate (PC), polyarylate, polyetherimide (PEI), polyether sulfone (PES), polyimide (PI), and the like. However, embodiments are not limited thereto, and the first substrate 100 may include various materials such as a glass material or a metal material as an alternative embodiment.

The second substrate 200 may include various materials as in the first substrate 100 described above, and may be formed using at least one of various materials capable of forming the first substrate 100 described above.

In a case where the organic light emitting display device according to an embodiment is a top emission type in which images are realized in a direction of the second substrate 200, the second substrate 200 includes a transparent material. However, the first substrate 10 does not necessarily include a transparent material. On the other hand, in a case where the organic light emitting display device according to an embodiment is a bottom emission type in which images are realized in a direction of the first substrate 100, the first substrate 100 includes a transparent material, but the second substrate 200 does not necessarily include a transparent material.

In a case where one of the first substrate 100 and the second substrate 200 does not include a transparent material, it may include an opaque material, for example, an opaque metal material. In a case where one of the first substrate 100 and the second substrate 200 includes a metal, it may include at least one selected from the group consisting of carbon, iron, chromium, manganese, nickel, titanium, molybdenum, and stainless steel (SUS), but embodiments are not limited thereto. The display unit 110 is disposed at an upper surface of the first substrate 100. Herein, the term "display unit 110" refers to an organic light emitting element (e.g., organic light emitting diode (OLED)) and a thin film transistor (TFT) array for driving the organic light emitting element, and means both of a portion for displaying images and a driving portion for displaying images. However, embodiments are not limited thereto. That is, the display unit 110 may be of various types, and may include, for example, a liquid crystal display (LCD) element. Hereinafter, an organic light emitting display device will be described as an example for convenience of explanation.

A sealing member 210 (see FIG. 2) is formed at the upper surface of the first substrate 100 so as to cover the display unit 110. The organic light emitting element included in the display unit 110 includes an organic material, and easily deteriorates by external moisture or oxygen. Accordingly, the sealing member 210 is formed to protect the display unit 110. The sealing member 210 may be formed using an organic material or an inorganic material. The sealing member 210 may include one or more organic layers or one or more inorganic layers, and as a specific example, one or more organic layers and one or more inorganic layers may be alternately stacked at least once.

As such, the sealing member 210 for protecting the display unit 110 may be formed, such that the display device may be easily made thin and flexible.

FIG. 2 shows a detailed cross-sectional view of the display unit 110 and a detailed cross-sectional view of the sealing member 210. When viewed in a plane, the display unit 110 includes a plurality of pixels in a matrix form.

The plurality of pixels may realize visible light of various colors, and may at least include a red pixel Pr for generating red visible light, a green pixel Pg for generating green visible light, and a blue pixel Pb for generating blue visible light.

Each pixel includes an organic light emitting element, and includes an electronic element electrically connected to the organic light emitting element. The electronic element may include one or more thin film transistors (TFTs), a storage capacitor, and the like. The electronic element may transmit, to the organic light emitting element, various suitable types of electric signals required for driving the organic light emitting element.

Although the organic light emitting element and the driving thin film transistor (TFT) for driving the organic light emitting element are only illustrated in FIG. 2, for the purpose of description, embodiments are not limited thereto. A plurality of thin film transistors (TFT), a storage capacitor, and various wirings may be further included.

The thin film transistor (TFT) illustrated in FIG. 2 is a top gate type, and sequentially includes an active layer 102, a gate electrode 104, a source electrode 106a and a drain electrode 106b. Although a top gate type thin film transistor (TFT) is disclosed here, embodiments are not limited thereto, and various suitable types of thin film transistors (TFT) may be employed.

Referring to FIG. 2, a buffer layer 101 may be formed at an upper surface of the first substrate 100 to provide flatness and prevent penetration of impurities.

The buffer layer 101 may be deposited by various suitable deposition methods such as plasma enhanced chemical vapor deposition (PECVD), atmospheric pressure CVD (APCVD), and low pressure CVD (LPCVD) using $SiO_2$ and/or $SiN_x$. The buffer layer 101 may not be formed if necessary. The active layer 102 is formed on the buffer layer 101 at a region corresponding to each pixel.

The active layer 102 may be formed by forming an organic semiconductor or an inorganic semiconductor such as silicon or an oxide semiconductor over an entire surface of the first substrate 100 on the buffer layer 101, and patterning the organic or inorganic semiconductor. A gate insulating layer 103 for insulating the active layer 102 from the gate electrode 104 is formed on the active layer 102.

The gate insulating layer 103 may include various suitable insulating materials, for example, an oxide or a nitride.

The gate electrode 104 is formed at a set or predetermined region on the gate insulating layer 103. The gate electrode 104 is connected to a gate line for applying on/off signals of the thin film transistor TFT.

An insulating interlayer 105 is formed on the gate electrode 104, and the source electrode 106a and the drain electrode 106b contact portions of the active layer 102 through contact holes, respectively. For example, the source electrode 106a and the drain electrode 106b are formed so as to contact a source region and a drain region of the active layer 102. The thus formed thin film transistor TFT is covered with a passivation layer 107 and protected.

The passivation layer 107 may use an inorganic insulating layer and/or an organic insulating layer. The inorganic insulating layer may include, for example, $SiO_2$, $SiN_x$, SiON, $Al_2O_3$, $TiO_2$, $Ta_2O_5$, $HfO_2$, $ZrO_2$, BST, and PZT. The organic insulating layer may include, for example, general polymer (PMMA, PS), a polymer derivative having a phenolic group, an acrylic polymer, an imide polymer, an aryl ether-based polymer, an amide-based polymer, a fluorine-based polymer, a p-xylene-based polymer, a vinyl alcohol-based polymer, and blends thereof. In addition, the passivation layer 107 may be formed as a composite laminate of an inorganic insulating layer and an organic insulating layer.

The organic light emitting element is provided on the passivation layer 107 at a light emitting area.

The organic light emitting display device may include a pixel electrode 111 formed on the passivation layer 107, an opposing electrode 112 opposing the pixel electrode 111, and an intermediate layer interposed therebetween and including an organic light emitting layer.

The organic light emitting display devices are classified into a bottom emission type, a top emission type, and a dual emission type according to the direction of light emission. In the case of the bottom emission type, the pixel electrode 111 is provided as a light transmitting electrode and the opposing electrode 112 is provided as a reflective electrode. In the case of the top emission type, the pixel electrode 111 is provided as a reflective electrode and the opposing electrode 112 is provided as a transflective electrode. In the present embodiment, the organic light emitting display device will be described as a top emission type in which it emits light in the direction of the sealing member 210.

The pixel electrode 111 may include a reflective layer including, for example, Ag, Mg, Al, Pt, Pd, Au, Ni, Nd, Ir, Cr and a compound thereof, and a light transmitting layer including, for example, ITO, IZO, ZnO, or $In_2O_3$ that have a high work function.

The pixel electrode 111 may be patterned in an island shape corresponding to each pixel. In addition, the pixel electrode 111 may be connected to an external terminal to serve as an anode electrode.

A pixel defining layer 109 that overlaps an edge portion of the pixel electrode 111 and has a set or predetermined opening exposing a center portion of the pixel electrode 111 is disposed on the pixel electrode 111. The light emitting area is defined by forming the organic light emitting layer 113, which emits light at a region defined by the opening. In an embodiment, when the light emitting area is defined by the opening of the pixel defining layer 109, a portion protruding from the light emitting area naturally occurs between the light emitting areas, and it becomes a non-light emitting area since no organic light emitting layer is formed thereat.

It is preferable that the opposing electrode 112 is a transmitting electrode. The opposing electrode 112 may be a transflective layer, which is formed as a thin metal layer including, for example, Li, Ca, LiF/Ca, LiF/Al, Al, Mg, and Ag that have a small work function. It is obvious that a light transmitting conductive layer including, for example, ITO, IZO, ZnO, or $In_2O_3$ is formed on the metal transflective layer so as to compensate for a high resistance problem caused by a small thickness of the metal transflective layer. The opposing electrode 112 may be formed over an entire surface of the first substrate 100 in the form of a common electrode. In addition, such an opposing electrode 112 may be connected to an external terminal and serve as a cathode electrode.

The intermediate layer may include the organic light emitting layer 113, which emits light, and the organic light emitting layer 113 may include a low molecular weight organic material or a high molecular weight organic material.

In addition to the organic light emitting layer 113, the intermediate layer may include at least one of a hole transporting layer (HTL), a hole injection layer (HIL), an electron transporting layer (ETL), and an electron injection layer (EIL). In an alternative embodiment, when the organic light emitting layer 113 includes a high molecular weight organic material, only a hole transporting layer may be provided between the organic light emitting layer 113 and the pixel electrode 111. A polymeric hole transporting layer may be formed on the pixel electrode 111 by a method of inkjet printing or spin coating using, for example, poly-(2, 4)-ethylene-dihydroxythiophene (PEDOT) or polyaniline (PANI).

The organic light emitting layer 113 includes a red light emitting layer, a green light emitting layer, and a blue light emitting layer. A red color filter, a green color filter, and a blue color filter are disposed on the red light emitting layer, the green light emitting layer, and the blue light emitting layer, respectively, in a corresponding manner. Accordingly, the red color filter, the green color filter, and the blue color filter selectively transmit only lights of specific wavelengths such as red, green, or blue, respectively, among lights emitted from the organic light emitting display device, and absorb light of the remaining wavelengths, thus allowing light of one of red, green, and blue to be emitted from each pixel.

The organic light emitting display device according to an embodiment illustrated in FIG. 2 may emit a white light by electrically driving the pixel electrode 111 and the opposing electrode 112. Examples of methods of realizing white light in the organic light emitting layer 113 may include: a wavelength conversion method in which phosphors are excited with a blue or violet light and lights of various colors emitted therefrom are mixed together to form a broad wavelength spectrum in a down conversion manner; and a color mixing method in which two primary colors (blue and orange) or three primary colors (red, green, and blue) are mixed together to form a white light. In the present invention, white light is implemented using a color mixing method.

In the organic light emitting display device according to an embodiment illustrated in FIG. 2, the sealing member 210 is formed on the first substrate 100 so as to cover the display unit 110. The sealing member 210 includes a plurality of laminated insulating layers. For example, the plurality of insulating layers have a laminate structure in which organic layers 202 and inorganic layers 201 and 203 are alternately laminated.

The inorganic layers 201 and 203 may include or be formed of a metal oxide, a metal nitride, a metal carbide and/or a compound thereof. In an embodiment, the inorganic layers 201 and 203 may be, for example, aluminum oxide, silicon oxide, or silicon nitride. The inorganic layers 201 and 203 serve to suppress moisture, oxygen, and the like from penetrating the organic light emitting display device.

The organic layer 202 may include a polymer organic compound, and may include any one of epoxy, acrylate, and urethane acrylate. The organic layer 202 serves to mitigate the internal stress of the inorganic layers 201 and 203, or to complement the defects of and planarize the inorganic layers 201 and 203.

The sealing member 210 is not limited to the structure illustrated in FIG. 2, and may include at least one sandwich structure in which at least one organic layer is disposed between at least two inorganic layers. As another example, the sealing member 210 may include at least one sandwich structure in which at least one inorganic layer is disposed between at least two organic layers. As another example, the sealing member 210 may include a sandwich structure in which at least one organic layer is disposed between at least two inorganic layers, and a sandwich structure in which at least one inorganic layer is disposed between at least two organic layers. An uppermost layer exposed to the outside of the sealing member 210 may be formed as an inorganic layer to prevent moisture permeation.

In such an embodiment, an area of a first organic layer may be less than an area of a second inorganic layer, and an area of a second organic layer may be less than an area of a third inorganic layer. As another example, the first organic layer may be formed so as to be completely covered with the second inorganic layer, and the second organic layer may be formed so as to be completely covered with the third inorganic layer The plurality of black matrices 212 are formed on the second substrate 200 as described above. The black matrix 212 is formed corresponding to the non-light emitting area. The black matrix 212 may be formed to have an opening corresponding to the light emitting area. In addition, the black matrix 212 substantially prevents visible lights of different colors, implemented in each pixel, from being mixed with each other abnormally or affecting each other. In addition, the black matrix 212 may substantially prevent members of the thin film transistor TFT from being damaged by external light.

The black matrix 212 may include various suitable materials. In the present invention, the black matrix 212 may be easily formed by using a black organic material mixed with a black pigment, chromium oxide ($CrO_x$), and/or the like.

A method of forming the black matrix 212 differs depending on the material forming the black matrix 212. However, when the black matrix 212 includes chromium or chromium oxide, which are generally used, a single layer of chromium or chromium oxide is formed through a method of sputtering, E-beam deposition, or the like. In some examples, double layers or triple layers may be formed using chromium or chromium oxide. A cross-section of the black matrix 212 may be rectangular, as illustrated in FIG. 2, or may be in a trapezoidal shape to increase the side luminance ratio.

In an embodiment, as illustrated in FIG. 2, the organic light emitting display device may include a plurality of color filters 211 corresponding to the plurality of light emitting areas.

For example, the plurality of color filters 211 may be disposed at the openings defined by the black matrix 212. In addition, part of the plurality of color filters 211 may overlap part of the black matrix 212. However, embodiments are not necessarily limited to such a structure, and the plurality of color filters 211 may be disposed so that the thickness of the plurality of color filters 211 is substantially equal to the thickness of the black matrix 212.

The plurality of color filters 211 may include a coloring material and an organic material in which the coloring material is dispersed. The coloring material may be a general pigment or a dye, and the organic material may be a common dispersing agent. The plurality of color filters 211 selectively pass only light of a specific wavelength, for example, red, green or blue, among lights emitted from the organic light emitting display device, and absorb lights of the remaining wavelengths, thereby allowing one of red, green, and blue lights to be emitted from each pixel. The plurality of color filters are disposed so that a red color filter 211R, a green color filter 211G, and a blue color filter 211B having red, green, and blue colors are disposed corresponding to the respective light emitting areas, and thus the plurality of light emitting areas may emit light of red, green, and blue colors.

Examples of the method of forming the plurality of color filters 211 include a pigment dispersion method, a printing method, an electrodeposition method, a film transfer method, and a thermal transfer method.

Hereinafter, with reference to FIGS. 3A and 3B, an emission spectrum of an organic light emitting element having a resonance structure before and after resonance will be described.

As used herein, the resonance structure refers to a structure in which an optical resonance or microcavity effect occurs, when an optical distance between two surfaces having reflectivity or semi-transmittance for incident light satisfies an interference condition for a light having a specific wavelength, thereby increasing a luminance or intensity of the light having the specific wavelength.

As illustrated in FIGS. 3A and 3B, when the organic light emitting element has a resonance structure, the emission spectrum of the organic light emitting element after resonance has a narrower wavelength spectrum and a peak of a greater light intensity compared to a wavelength spectrum and a peak of a light intensity before resonance.

Herein, a peak of a light intensity of the blue organic light emitting element after resonance increases by about 30% or more compared to that before resonance. That is, the peak of the light intensity of the blue organic light emitting element before resonance is 1 (as a relative value) in light intensity at 456.4 nm, while the peak of the light intensity of the blue organic light emitting element after resonance is 1.32 (as a relative value) in light intensity at 455.7 nm.

In addition, for example, an emission spectrum of the blue organic light emitting element before resonance is in a range from about 438 nm to about 510 nm with respect to a relative value of light intensity of 0.2, and an emission spectrum of the blue organic light emitting element after resonance is in a range from about 441 nm to about 482 nm with respect to the relative value of light intensity of 0.2. Accordingly, a transmission spectrum of the color filter is set corresponding to the emission spectrum after resonance with respect to the relative value of light intensity of 0.2.

Hereinafter, emission spectra of the organic light emitting element having a resonance structure and relevant changes in side luminance ratios will be described with reference to FIG. 4.

In general, the organic light emitting display device may be used in various viewing angle modes according to the use state. A viewing angle θ of the organic light emitting display device according to an embodiment may variously change from about 0°, which is a state where a user views the organic light emitting display device from the front, to about 60°.

As the viewing angle θ changes from 0° to 60°, the emission spectra of red, green and blue colors change.

A blue shift of the emission spectra of red R, green G and blue B occurs to the maximum at a viewing angle of about 60°, and the results are shown in Table 1 below.

TABLE 1

| Classification | R | G | B |
| --- | --- | --- | --- |
| Shift amount (nm) | 83 | 65 | 39 |

As may be appreciated from Table 1, in the case of a red wavelength, as the viewing angle θ changes from 0° to 60°, a peak of the wavelength may be shifted by about 83 nm to the maximum (at a viewing angle of 60°); in the case of a green wavelength, as the viewing angle θ changes from 0° to 60°, a peak of the wavelength may be shifted by about 65 nm to the maximum (at a viewing angle of 60°); and in the case of a blue wavelength, as the viewing angle θ changes from 0° to 60°, a peak of the wavelength may be shifted by about 39 nm to the maximum (at a viewing angle of 60°). However, the wavelength band that the color filter 211 may transmit is set or predetermined, as described above. Accordingly, as the emission spectra of red, green, and blue colors are shifted, an amount of light transmitted through the color filter 211 may change, and a side luminance ratio based on the viewing angle θ of the finally emitted light may change.

In other words, since at least one of the organic light emitting elements may have a resonance structure, as the viewing angle θ of the organic light emitting element changes from 0° to 60°, the emission spectrum of red, green, and blue colors may change toward shorter wavelengths.

In the case of a red emission spectrum, as the viewing angle changes from 0° to 60°, the peak of the wavelength of the red organic light emitting element is shifted by a range from about 60 nm to about 83 nm.

In the case of a green emission spectrum, as the viewing angle changes from 0° to 60°, the peak of the wavelength of the green organic light emitting element is shifted by a range from about 55 nm to about 65 nm.

In addition, in the case of a blue emission spectrum, the peak of the wavelength of the light emitted from the blue organic light emitting element is shifted by a range from about 34 nm to about 39 nm.

For example, in the case of the red color filter 211R, since the peak of the red wavelength is shifted by about 83 nm to the maximum, as the viewing angle changes from 0° to 60°, the red light of a wavelength corresponding to a first area R1 may not be transmitted through the red color filter 211R. Accordingly, a side luminance ratio of the finally emitted red light may be reduced. Referring to the graph related to the side luminance ratio, it may be appreciated that the side luminance ratio of the red light decreases, as the viewing angle θ increases.

In addition, in the case of the green and blue color filters 211G and 211B, since the peaks of the green and blue wavelengths are shifted to the maximum by about 65 nm and about 39 nm, respectively, as the viewing angle changes from 0° to 60°, the green light of a wavelength corresponding to a second area G1 may not be transmitted through the green color filter 211G, and the blue light of a wavelength corresponding to a third area B1 may not be transmitted through the blue color filter 211B. Accordingly, each of side luminance ratios of the finally emitted green and blue lights decreases, as the viewing angle θ increases. However, referring to the graph related to the side luminance ratio, it may be appreciated that as the viewing angle θ increases, the side luminance ratios of the green and blue lights decrease much less than the side luminance ratio of the red light does. This is because an amount of light in the first area R1 that may not pass through the red color filter 211R is greater than each of the amounts of lights in the second and third areas G1 and B1 that may not pass through the green and blue color filters 211G and 211B.

Figure 5:
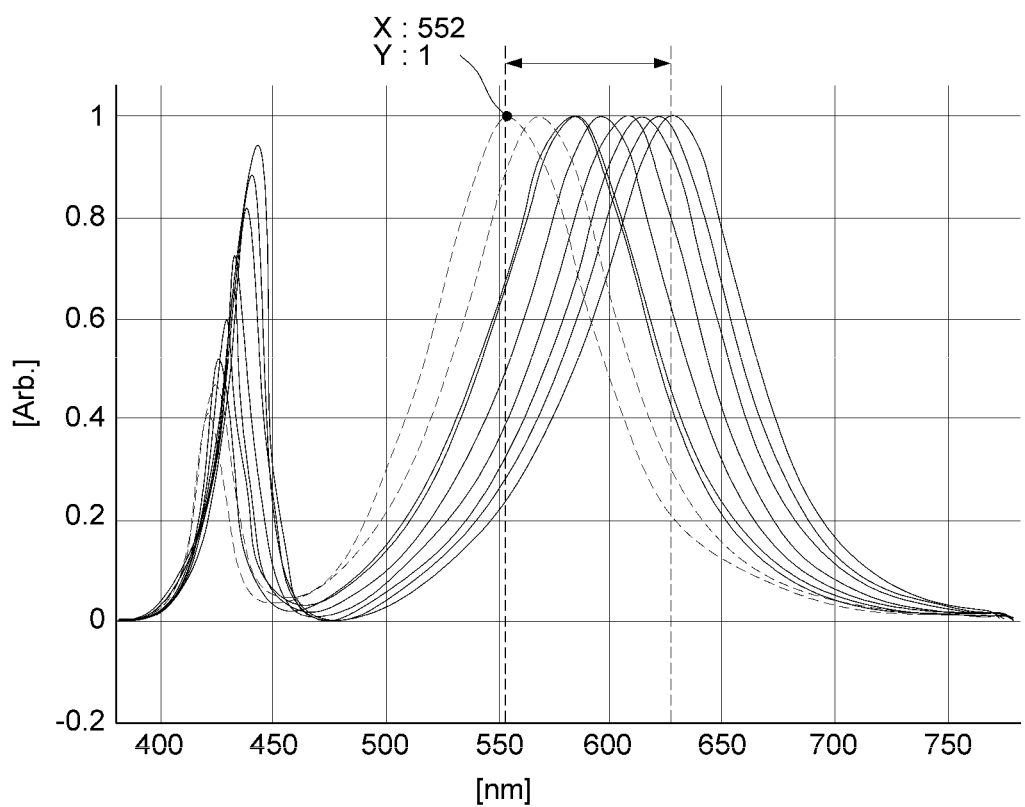
FIG. 5 is a graph illustrating changes of an emission spectrum of a red organic light emitting element according to an example embodiment when a viewing angle is changed from 0° to 60° at intervals of 3°.
Figure 6:
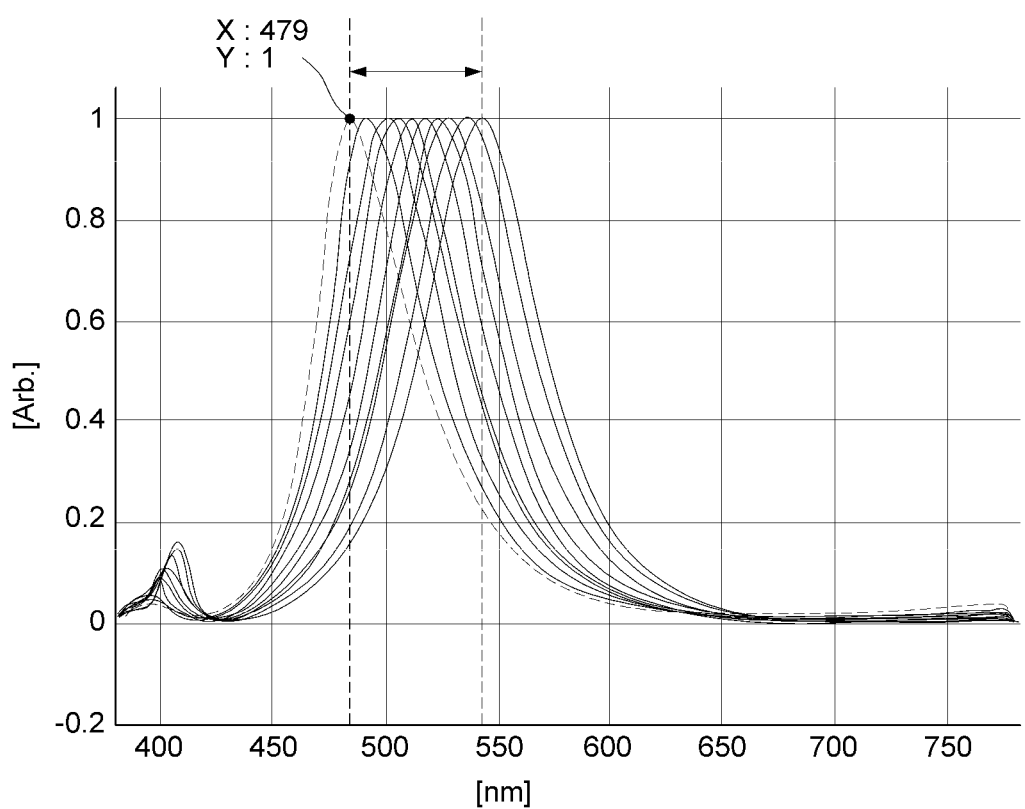
FIG. 6 is a graph illustrating changes of an emission spectrum of a green organic light emitting element according to an example embodiment when a viewing angle is changed from 0° to 60° at intervals of 3°.
Figure 7:
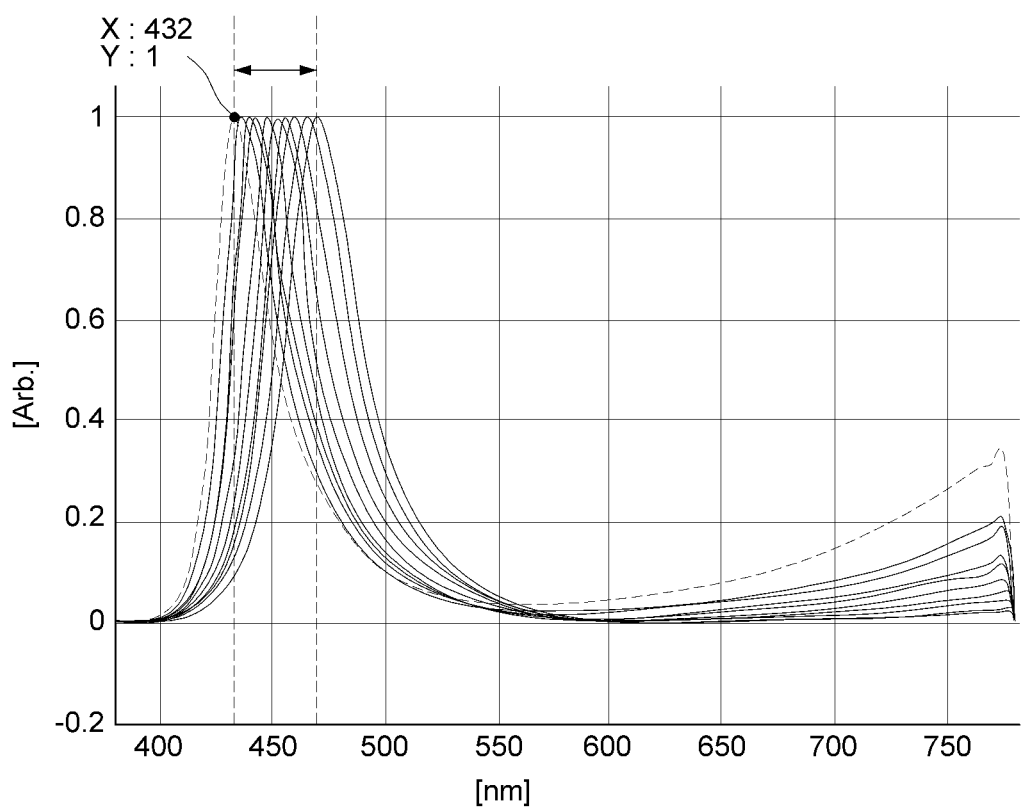
FIG. 7 is a graph illustrating changes of an emission spectrum of a blue organic light emitting element according to an example embodiment when a viewing angle is changed from 0° to 60° at intervals of 3°.

FIG. 5 is a graph illustrating changes in emission spectrum when the viewing angle of the red organic light emitting element according to an embodiment is changed from 0° to 60° at intervals of 3°, FIG. 6 is a graph illustrating changes in emission spectrum when the viewing angle of the green organic light emitting element according to an embodiment is changed from 0° to 60° at intervals of 3°, and FIG. 7 is a graph illustrating changes in emission spectrum when the viewing angle of the blue organic light emitting element according to an embodiment is changed from 0° to 60° at intervals of 3°.

Referring to FIG. 5, it may be appreciated that a peak wavelength of the emission spectrum of the red organic light emitting element in the organic light emitting display device according to an embodiment is changed from about 635 nm to about 552 nm, as the viewing angle changes from 0° to 60°.

Referring to FIG. 5, the red emission spectrum (solid line) is changed to a green emission spectrum (dotted line) at a viewing angle of about 45° or greater in the red organic light emitting element.

In other words, in the red organic light emitting element, the red emission spectrum (solid line) is changed to a green emission spectrum (dotted line) at a viewing angle of 45° or greater with the peak of light intensity of about 575 nm.

In addition, referring to FIG. 6, it may be appreciated that a peak wavelength of the emission spectrum of the green organic light emitting element in the organic light emitting display device according to an embodiment changes from about 544 nm to about 479 nm, as the viewing angle changes from 0° to 60°. The green emission spectrum (solid line) is changed to a blue emission spectrum (dotted line) at a viewing angle of about 45° or greater in the green organic light emitting element.

In other words, in the green organic light emitting element, the green emission spectrum (solid line) is changed to a blue emission spectrum (dotted line) at a viewing angle of 45° or greater with the peak of light intensity of about 485 nm.

In addition, referring to FIG. 7, it may be appreciated that a peak wavelength of the emission spectrum of the blue organic light emitting element in the organic light emitting display device according to an embodiment changes from about 471 nm to about 432 nm, as the viewing angle changes from 0° to 60°.

Hereinafter, referring to FIGS. 8 and 9, emission spectra of the red, green, and blue organic light emitting elements according to an embodiment, having a resonance structure, in accordance with a change in viewing angle, and the transmission spectra of the red, green, and blue color filters 211R, 211G, and 211B will be compared.

Figure 8:
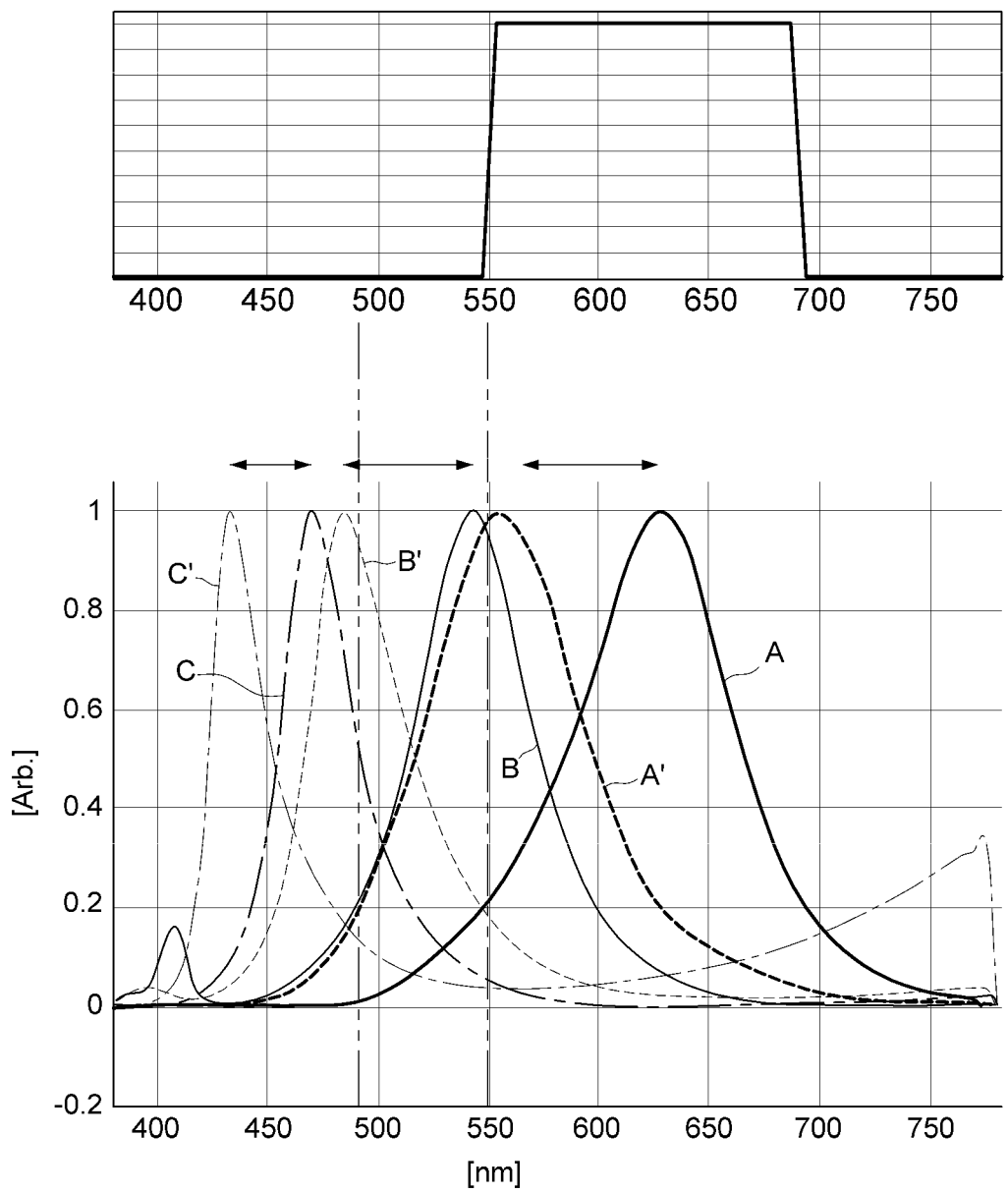
FIG. 8 is a graph illustrating an optical loss, caused by a change in viewing angle, at a red color filter that has a transmission wavelength band corresponding to an emission spectrum of the red organic light emitting element after resonance.
Figure 9:
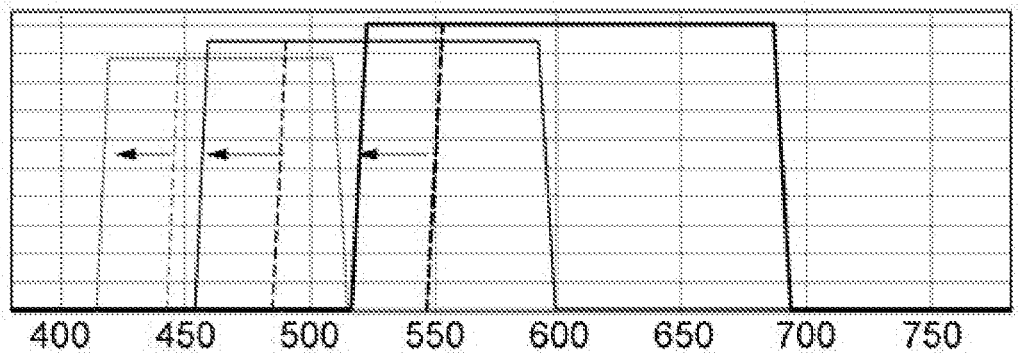
FIG. 9 is a graph illustrating changes in peak of a light intensity of an organic light emitting element in accordance with an increase in viewing angle; and a transmission wavelength band of a color filter according to an example embodiment for compensating for changes in peak.
Figure 9:
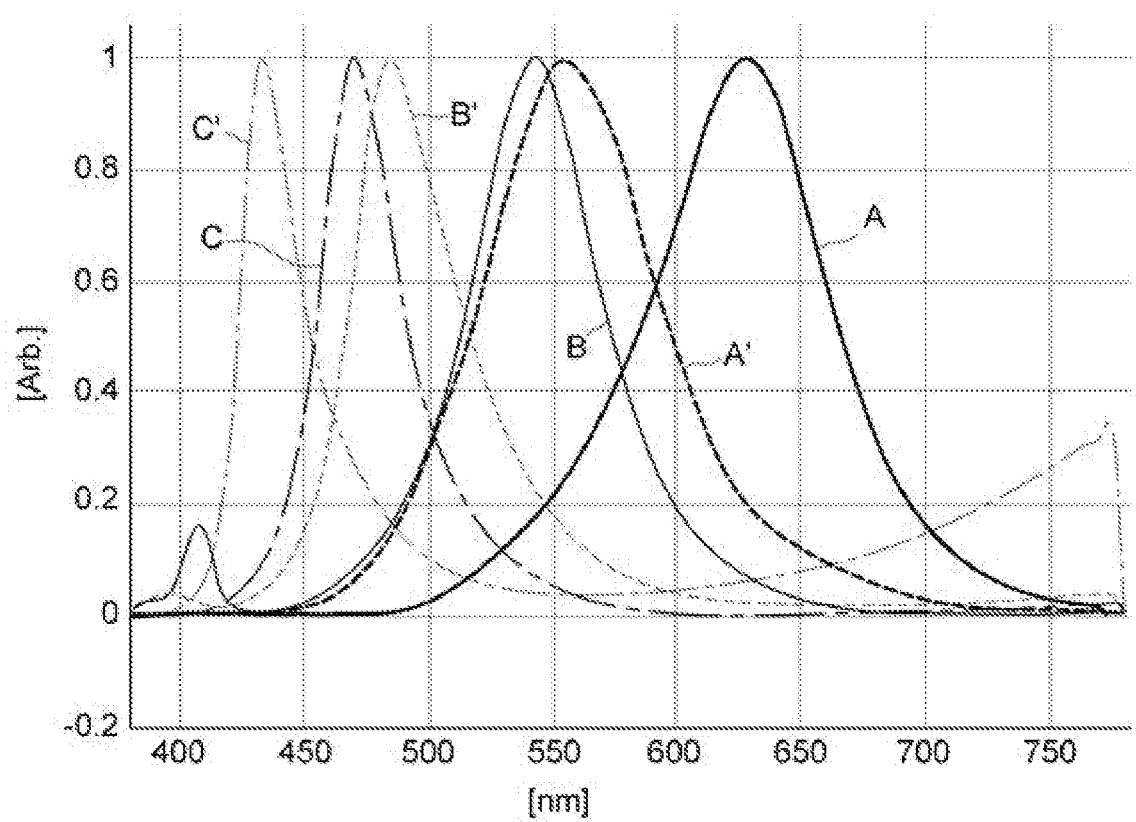

FIG. 8 is a graph illustrating an optical loss, caused by a change in viewing angle, at a red color filter that has a transmission wavelength band corresponding to an emission spectrum of the red organic light emitting element after resonance, and FIG. 9 is a graph illustrating changes in peak of a light intensity of an organic light emitting element in accordance with an increase in viewing angle; and a transmission wavelength band of a color filter according to an embodiment for compensating for changes in peak.

Referring to FIGS. 8 and 9, as described above, when the color filter 211 has a transmission wavelength band for transmitting a light having a set or predetermined light intensity or greater, corresponding to the resonance structure of the organic light emitting element, the light emitted from the organic light emitting element has an emission spectrum shifted toward shorter wavelengths, as the viewing angle increases. Accordingly, an amount of light transmitted through the color filter 211 is reduced, as the viewing angle increases.

For example, referring to curves A, B, and C of FIG. 8, a color filter generally has a transmission wavelength band for transmitting a light that has a relative light intensity of 0.2 or greater, among lights emitted from the organic light emitting element, at the viewing angle of 0°. In such a case, an upper limit value and a lower limit value of the transmission wavelength band of the color filter are set to transmit a wavelength of a first intensity or greater, which is the same relative light intensity (hereinafter, light intensity means relative light intensity).

In such a case, the light emitted from the red organic light emitting element is shifted toward shorter wavelengths more, as compared to an organic light emitting element of another color, as the viewing angle increases. Accordingly, an amount of light transmitted through the red color filter is reduced more than those of other color filters are reduced.

Referring to FIG. 8, the red color filter 211R that has a transmission wavelength band corresponding to the emission spectrum after resonance may not transmit light in a range from about 515 nm to about 545 nm, which is an area between two alternate long and two short dashes lines. In other words, the red color filter 211R having the transmission wavelength band corresponding to the emission spectrum after resonance may not transmit light, emitted from the red organic light emitting element, in a wavelength band between a cross point (at 545 nm) where an emission spectrum (thick solid line A) of the red organic light emitting element after resonance at the viewing angle of 0° crosses an emission spectrum (dotted line B') of the green organic light emitting element after resonance; and a cross point (at 515 nm) where an emission spectrum (thick dotted line A') of the red organic light emitting element after resonance at an increased viewing angle, for example, 60°, crosses the emission spectrum (dotted line B') of the green organic light emitting element after resonance.

Similarly, referring to FIG. 8, the green color filter 211G having a transmission wavelength band corresponding to the emission spectrum after resonance may not transmit light in a range from about 460 nm to about 480 nm, which is an area between solid lines in FIG. 8. In other words, the green color filter 211G that has the transmission wavelength band corresponding to the emission spectrum after resonance may not transmit light, emitted from the green organic light emitting element, in a wavelength band between a cross point (at 480 nm) where an emission spectrum (solid line B) of the green organic light emitting element after resonance at the viewing angle of 0° crosses an emission spectrum (thin alternate long and short dash line C') of the blue organic light emitting element after resonance; and a cross point (at 460 nm) where an emission spectrum (dotted line B') of the green organic light emitting element after resonance at an increased viewing angle, for example, 60°, crosses the emission spectrum (thin alternate long and short dash line C') of the blue organic light emitting element after resonance.

The color filter according to an embodiment has a transmission wavelength band that is greater toward shorter wavelengths, in consideration of the wavelength shift according to the viewing angle. In other words, the transmission wavelength band of the color filter according to an embodiment has an upper limit value for transmitting a light wavelength corresponding to a first intensity of the light emitted from the organic light emitting element at a viewing angle of 0°, and has a lower limit value for transmitting a wavelength of a second intensity, which is less than the first intensity.

For example, referring to the curve A in FIGS. 8 and 9, the transmission wavelength band of the red color filter 211R according to an embodiment has an upper limit value (e.g., about 690 nm) for transmitting a light wavelength corresponding to 0.2, which is the first intensity of the light emitted from the red organic light emitting element at the viewing angle of 0°, and has a lower limit value (e.g., about 515 nm) for transmitting a wavelength corresponding to 0.10, which is a second intensity less than the first intensity.

In addition, referring to FIG. 9, the red color filter 211R according to an embodiment has a transmission wavelength band for transmitting a wavelength at which an intensity of a light emitted from the green organic light emitting element is substantially the same as an intensity of a light emitted from the red organic light emitting element at an arbitrary viewing angle of about 60° or less. In addition, the red color filter 211R according to an embodiment has a transmission wavelength band that does not transmit a wavelength corresponding to a peak point of the intensity of the light emitted from the green organic light emitting element at an arbitrary viewing angle of about 60° or less.

In other words, the lower limit value of the transmission wavelength band of the red color filter 211R according to an embodiment is greater than a wavelength of the peak of the light intensity of the green organic light emitting element at the viewing angle of 0°, and is less than a wavelength at which the light intensity of the green organic light emitting element is the same as the light intensity of the red organic light emitting element at an arbitrary viewing angle of about 60° or less. That is, the lower limit value of the transmission wavelength band of the red color filter 211R is located between about 515 nm and about 545 nm.

Preferably, as illustrated in FIG. 5, considering that a viewing angle at which the peak of the light intensity of the red emission spectrum (solid line) is changed to the green emission spectrum (dotted line) is 45°, the lower limit value of the transmission wavelength band of the red color filter 211R may be set with respect to the viewing angle of 45°.

In addition, the upper limit value of the transmission wavelength band of the red color filter 211R according to an embodiment is, for example, 690 nm, which is the same as an upper end of the emission spectrum after resonance at the viewing angle of 0° when the relative light intensity is 0.2. However, embodiments are not limited thereto, and the upper limit value of the transmission wavelength band of the red color filter 211R may be a value between about 690 nm and about 722 nm, which is greater than the upper end of the emission spectrum after resonance by a range from about 0 nm to about 32 nm.

Referring to FIG. 9, the red color filter 211R according to an embodiment has a transmission wavelength band ranging from about 515 nm to about 690 nm when compensating for optical losses that occur up to a viewing angle of 60°.

When compensating for optical losses that occur up to a viewing angle of 45°, the red color filter 211R according to an embodiment has a lower limit value of the transmission wavelength band, which is greater than 515 nm and less than 545 nm.

Accordingly, the red color filter 211R according to an embodiment may also transmit the light wavelength at the cross point where the emission spectrum (thick dotted line A') of the red organic light emitting element after resonance at an increased viewing angle crosses the emission spectrum (dotted line B') of the green organic light emitting element after resonance. Accordingly, the red color filter 211R according to an embodiment may substantially prevent optical losses of the red organic light emitting element at an increased viewing angle.

Similarly, referring to the curve B in FIG. 9, the transmission wavelength band of the green color filter 211G according to an embodiment has an upper limit value (e.g., about 600 nm) for transmitting a light wavelength corresponding to 0.2, which is the first intensity of the light emitted from the green organic light emitting element at the viewing angle of 0°, and has a lower limit value (e.g., about 460 nm) for transmitting a wavelength corresponding to 0.07, which is a second intensity less than the first intensity.

In addition, the green color filter 211G according to an embodiment has a transmission wavelength band for transmitting a wavelength at which an intensity of a light emitted from the blue organic light emitting element is substantially the same as an intensity of a light emitted from the green organic light emitting element at an arbitrary viewing angle of about 60° or less. In addition, the green color filter 211G according to an embodiment has a transmission wavelength band that does not transmit a wavelength corresponding to a peak point of the intensity of the light emitted from the blue organic light emitting element at an arbitrary viewing angle of about 60° or less.

In other words, the lower limit value of the transmission wavelength band of the green color filter 211G according to an embodiment is greater than a wavelength of the peak of the light intensity of the blue organic light emitting element at the viewing angle of 0°, and is less than a wavelength at which the light intensity of the blue organic light emitting element is the same as the light intensity of the green organic light emitting element at an arbitrary viewing angle of about 60° or less. That is, the lower limit value of the transmission wavelength band of the green color filter 211G is located between about 460 nm and about 480 nm.

Preferably, as illustrated in FIG. 6, considering that a viewing angle at which the peak of the light intensity of the green emission spectrum (solid line) is changed to the blue emission spectrum (dotted line) is 45°, the lower limit value of the transmission wavelength band of the green color filter 211G may be set with respect to the viewing angle of 45°.

In addition, the upper limit value of the transmission wavelength band of the green color filter 211G according to an embodiment is, for example, 600 nm, which is the same as an upper end of the emission spectrum after resonance at the viewing angle of 0° when the relative light intensity is 0.2. However, embodiments are not limited thereto, and the upper limit value of the transmission wavelength band of the green color filter 211G may be a value between about 600 nm and about 625 nm, which is greater than the upper end of the emission spectrum after resonance by a range from about 0 nm to about 25 nm.

Referring to FIG. 9, the green color filter 211G according to an embodiment has a transmission wavelength band ranging from about 460 nm to about 600 nm when compensating for optical losses that occur up to a viewing angle of 60°.

When compensating for optical losses that occur up to a viewing angle of 45°, the green color filter 211G according to an embodiment has a lower limit value of the transmission wavelength band, which is greater than 460 nm and less than 480 nm.

Accordingly, the green color filter 211G according to an embodiment may also transmit the light wavelength at the cross point where the emission spectrum (dotted line B') of the green organic light emitting element after resonance at an increased viewing angle crosses the emission spectrum (thin alternate long and short dash line C') of the blue organic light emitting element after resonance. Accordingly, the green color filter 211G according to an embodiment may substantially prevent optical losses of the green organic light emitting element at an increased viewing angle.

The blue color filter 211B according to an embodiment has a transmission wavelength band for transmitting all the wavelengths corresponding to peak points of the light intensity of the blue organic light emitting element from the viewing angle 0° to the viewing angle 60°.

Referring to FIG. 9, the transmission wavelength band of the blue color filter 211B according to an embodiment has an upper limit value (e.g., about 515 nm) for transmitting a light wavelength corresponding to 0.2, which is the first intensity of the light emitted from the blue organic light emitting element at the viewing angle of 0°, and has a lower limit value (e.g., about 430 nm) for transmitting a wavelength corresponding to 0.02, which is a second intensity less than the first intensity.

Referring to FIG. 9, the upper limit value (e.g., 515 nm) of the transmission wavelength band of the blue color filter 211B according to an embodiment may be greater than a wavelength (e.g., 505 nm) at a cross point where the light intensity of the blue organic light emitting element is the same as the light intensity of the green organic light emitting element at the viewing angle of 0°.

In an embodiment, the upper limit value of the transmission wavelength band of the blue color filter 211B according to an embodiment is set to be, for example, 515 nm, which is the same as an upper end of the emission spectrum after resonance at the viewing angle of 0° when the relative light intensity is 0.2. However, embodiments are not limited thereto, and the upper limit value of the transmission wavelength band of the blue color filter 211B may be a value between about 515 nm and about 530 nm, which is greater than the upper end of the emission spectrum after resonance by a range from about 0 nm to about 15 nm.

Referring to FIG. 9, the blue color filter 211B according to an embodiment has a transmission wavelength band ranging from about 430 nm to about 515 nm so as to compensate for optical losses at a viewing angle from 0° to about 60°.

As described above, the lower limit value of the transmission wavelength band of each color filter is less than the lower limit value of the wavelength of each corresponding one of the organic light emitting elements corresponding to the first light intensity (for example, 0.2).

In an embodiment, the lower limit values of the transmission wavelength bands of the red color filter, the green color filter, and the blue color filter are sequentially further apart from the lower limit value of the wavelength of each corresponding one of the organic light emitting elements corresponding to the first light intensity. That is, the lower limit values of the transmission wavelength bands of the red color filter 211R, the green color filter 211G, and the blue color filter 211B according to an embodiment expand further toward shorter wavelengths in the order of R>G>B compared to the lower limit value of the transmission wavelength band of each corresponding one of the color filters, which is set to be the same as the lower limit value of the emission spectrum of each corresponding one of the organic light emitting elements after resonance corresponding to the first light intensity.

In addition, the second light intensity of the organic light emitting element for setting the lower limit value of the transmission wavelength band of the color filter 211 according to an embodiment becomes smaller in the order of the red organic light emitting element, the green organic light emitting element, and the blue organic light emitting element, satisfying R>G>B.

Hereinafter, an organic light emitting display device according to another embodiment will be described with reference to FIG. 10.

Figure 10:
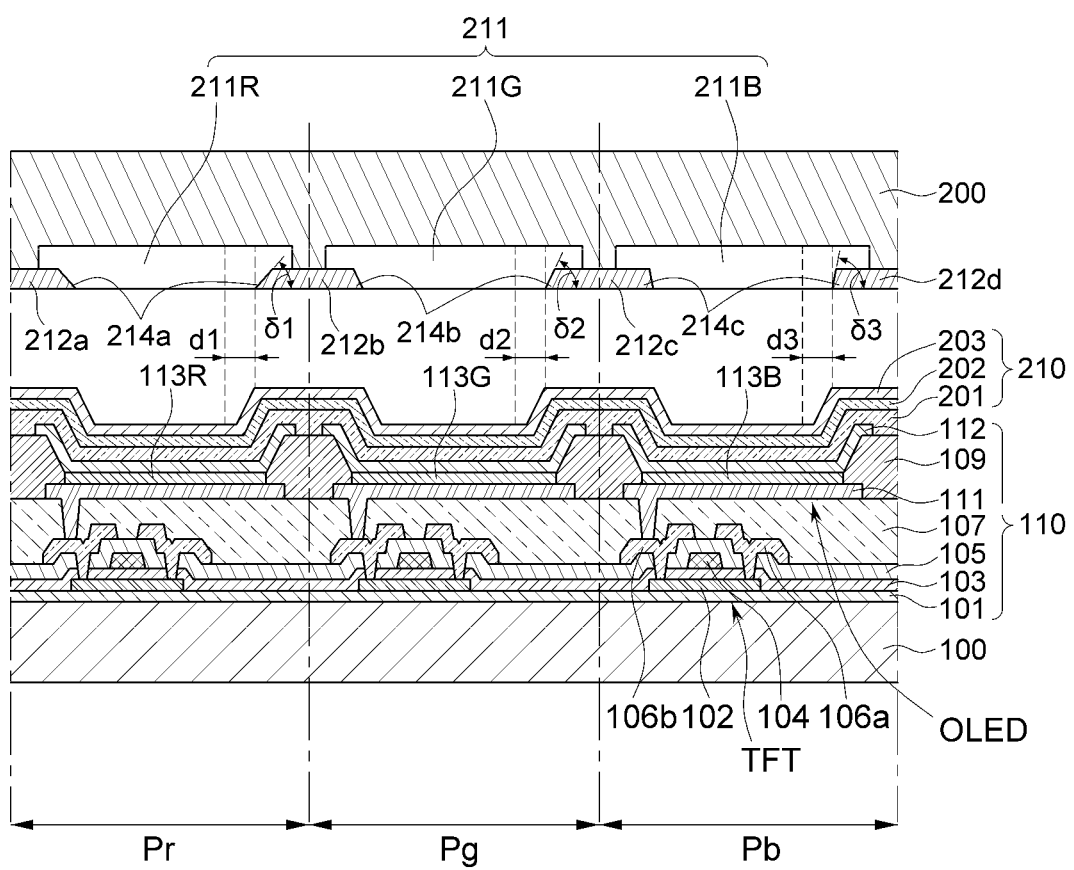
FIG. 10 is a schematic cross-sectional view illustrating an organic light emitting display device according to another example embodiment.

FIG. 10 is a schematic cross-sectional view illustrating an organic light emitting display device according to another embodiment.

Referring to FIG. 10, an organic light emitting display device according to another embodiment may adjust a first separation distance d1 between an edge portion of the red color filter 211R and an edge portion of a black matrix 212b, a second separation distance d2 between an edge portion of the green color filter 211G and an edge portion of a black matrix 212c, and a third separation distance d3 between an edge portion of the blue color filter 211B and an edge portion of a black matrix 212d.

In the present embodiment, the first, second, and third separation distances d1, d2, and d3 may be adjusted, in consideration of changes in a side luminance ratio of each wavelength according to a change in the viewing angle θ, and thus the optical losses may be substantially prevented. In such an embodiment, since the changes in the side luminance ratios of the respective wavelengths are different from each other, the first, second, and third separation distances d1, d2, and d3 may also be determined differently. However, since a change in the side luminance ratio by the red light is relatively greater than changes in the side luminance ratios by the green light and the blue light, the compensation amount for the optical loss is determined by the first separation distance d1. As an example, the first separation distance d1 may be formed to be greater than the second separation distance d2 and the third separation distance d3. As another example, the second separation distance d2 may be formed to be greater than the third separation distance d3.

For example, the first separation distance d1 between an end portion of the red color filter 211R and an end portion of a black matrix adjacent thereto, the second separation distance d2 between an end portion of the green color filter 211G and an end portion of a black matrix adjacent thereto, and a third separation distance d3 between an end portion of the blue color filter 211B and an end portion of a black matrix adjacent thereto are different from each other, and the sizes thereof satisfy d1>d2>d3.

In an embodiment, taper angles of end portions of the black matrices 212a, 212b, 212c, and 212d may be adjusted, in addition to the separation distances d1, d2, and d3, so as to adjust the side luminance ratio according to the viewing angle θ.

Each of end portions of the black matrices adjacent to the color filters according to an embodiment, which transmit different colors, has a taper angle of about 90° or less. In addition, respective end portions of the black matrices adjacent to the color filters transmitting different colors have taper angles different from each other.

Referring to FIG. 10, an end portion 214a of the black matrix adjacent to the red color filter 211R has a first inclination angle δ1, which is less than 90°. Accordingly, the end portion 214a of the black matrix adjacent to the red color filter 211R may transmit the light emitted from the red organic light emitting element well, at an increased viewing angle θ, as compared to the case of the inclination angle of 90°.

An end portion 214b of the black matrix adjacent to the green color filter 211G has a second inclination angle δ2, which is less than 90° and greater than the first inclination angle δ1. Accordingly, the end portion 214b of the black matrix adjacent to the green color filter 211G may transmit the light emitted from the green organic light emitting element well, at an increased viewing angle θ, as compared to the case of the inclination angle of 90°.

An end portion 214c of the black matrix adjacent to the blue color filter 211B has a third inclination angle δ3, which is less than 90° and greater than the second inclination angle δ2.

Accordingly, when the sizes of the first inclination angle δ1 of the end portion 214a of the black matrix adjacent to the red color filter 211R, the second inclination angle δ2 of the end portion 214b of the black matrix adjacent to the green color filter 211G, and the third inclination angle δ3 of the end portion 214c of the black matrix adjacent to the blue color filter 211B are compared, "δ1<δ2<δ3" is satisfied.

In addition, it is obvious that the side luminance ratios of the red, green, and blue organic light emitting elements may be adjusted by both adjusting the taper angles δ1, δ2, and δ3 of the end portions 214a, 214b, and 214c of the black matrix, and adjusting the first, second, and third separation distances d1, d2, and d3, and accordingly, the optical losses may be substantially prevented.

The organic light emitting display device according to embodiments of the present invention described above may compensate for optical losses due to the blue shift, and is thereby capable of reducing the luminance difference of the organic light emitting display device according to the viewing angle.

As set forth hereinabove, an organic light emitting display device according to one or more embodiments may compensate for optical losses that may occur due to the blue shift, by expanding a transmission wavelength band of a color filter toward shorter wavelengths.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

As used herein, the terms "use," "using," and "used" may be considered synonymous with the terms "utilize," "utilizing," and "utilized," respectively.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

While the present invention has been illustrated and described with reference to the embodiments thereof, it will be apparent to those of ordinary skill in the art that various suitable changes in form and detail may be made thereto without departing from the spirit and scope of the present invention.

What is claimed is:

1. An organic light emitting display device comprising:
a first substrate;
a second substrate opposite from the first substrate;
a plurality of organic light emitting elements on the first substrate; and
a color filter on the plurality of organic light emitting elements,
wherein a transmission wavelength band of the color filter has an upper limit value for transmitting a light wavelength corresponding to a first intensity of a light emitted from the organic light emitting elements at a viewing angle of about 0°, and has a lower limit value for transmitting a light wavelength corresponding to a second intensity that is less than the first intensity,
wherein the plurality of organic light emitting element comprises a red organic light emitting element, a green organic light emitting element, and a blue organic light emitting element,
wherein the color filter comprises a first color filter on the red organic light emitting element, a second color filter on the green organic light emitting element, and a third color filter on the blue organic light emitting element, and
wherein the second intensity decreases in an order of the red organic light emitting element, the green organic light emitting element, and the blue organic light emitting element.

2. The organic light emitting display device of claim 1, wherein the lower limit value of the transmission wavelength band of the color filter is less than a lower limit value of a light wavelength of the organic light emitting elements corresponding to the first intensity.

3. The organic light emitting display device of claim 1, wherein lower limit values of transmission wavelength bands of the first color filter, the second color filter, and the third color filter are sequentially further apart from a lower limit value of a wavelength of each corresponding one of the organic light emitting elements corresponding to the first intensity.

4. The organic light emitting display device of claim 3, wherein the first color filter has a transmission wavelength band for transmitting a wavelength at which an intensity of a light emitted from the green organic light emitting element is substantially a same as an intensity of a light emitted from the red organic light emitting element at an arbitrary viewing angle of about 60° or less.

5. The organic light emitting display device of claim 4, wherein the first color filter has a transmission wavelength band that does not transmit a wavelength corresponding to a peak point of the intensity of the light emitted from the green organic light emitting element at a viewing angle of about 60°.

6. The organic light emitting display device of claim 3, wherein the second color filter has a transmission wavelength band for transmitting a wavelength at which an intensity of a light emitted from the blue organic light emitting element is substantially a same as an intensity of a light emitted from the green organic light emitting element at an arbitrary viewing angle of about 60° or less.

7. The organic light emitting display device of claim 6, wherein the second color filter has a transmission wavelength band that does not transmit a wavelength corresponding to a peak point of the intensity of the light emitted from the blue organic light emitting element at a viewing angle of about 60°.

8. The organic light emitting display device of claim 3, wherein the third color filter has a transmission wavelength band that transmits all wavelengths corresponding to a peak point of an intensity of a light emitted from the blue organic light emitting element at a viewing angle of about 0° to about 60°.

9. The organic light emitting display device of claim 3, wherein an upper limit value of the transmission wavelength band of the third color filter is greater than a wavelength at a cross point at which an intensity of a light emitted from the blue organic light emitting element is substantially a same as an intensity of a light emitted from the green organic light emitting element, at a viewing angle of about 0°.

10. The organic light emitting display device of claim 3, wherein a lower limit value of the transmission wavelength band of the first color filter is about 515 nm to about 545 nm.

11. The organic light emitting display device of claim 3, wherein the first color filter has a transmission wavelength band of about 515 nm to about 690 nm,
    wherein the second color filter has a transmission wavelength band of about 460 nm to about 600 nm, and
    wherein the third color filter has a transmission wavelength band of about 430 nm to about 510 nm.

12. The organic light emitting display device of claim 3, wherein a lower limit value of the transmission wavelength band of the second color filter is about 460 nm to about 480 nm.

13. The organic light emitting display device of claim 8, wherein an upper limit value of the transmission wavelength band of the third color filter about 515 nm to about 530 nm.

* * * * *